United States Patent
De Leeuw et al.

(10) Patent No.: US 6,635,406 B1
(45) Date of Patent: Oct. 21, 2003

(54) METHOD OF PRODUCING VERTICAL INTERCONNECTS BETWEEN THIN FILM MICROELECTRONIC DEVICES AND PRODUCTS COMPRISING SUCH VERTICAL INTERCONNECTS

(75) Inventors: Dagobert Michel De Leeuw, Eindhoven (NL); Gerwin Hermanus Gelinck, Eindhoven (NL); Marco Matters, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 66 days.

(21) Appl. No.: 09/704,519

(22) Filed: Nov. 2, 2000

(30) Foreign Application Priority Data

Nov. 2, 1999  (EP) ............................................. 99203603

(51) Int. Cl.[7] ........................ H01L 21/00; H01L 29/00; G03F 7/00
(52) U.S. Cl. ....................... 430/311; 430/312; 430/315; 438/99; 438/218; 438/659
(58) Field of Search ................................ 430/312, 311, 430/315, 326, 329, 5, 394; 438/218, 659; 257/66, 59

(56) References Cited

U.S. PATENT DOCUMENTS

| | | | |
|---|---|---|---|
| 4,702,792 A | 10/1987 | Chow et al. ................. | 156/628 |
| 5,266,446 A | * 11/1993 | Chang et al. ................ | 430/313 |
| 5,567,550 A | 10/1996 | Smayling ........................ | 430/5 |
| 5,677,041 A | 10/1997 | Smayling .................... | 428/209 |
| 5,686,702 A | 11/1997 | Ishida ......................... | 174/250 |
| 5,689,428 A | 11/1997 | Sauerbrey et al. .......... | 364/480 |
| 5,691,089 A | 11/1997 | Smayling ...................... | 257/40 |
| 5,759,737 A | 6/1998 | Feilchenfeld et al. ........ | 430/311 |
| 6,403,396 B1 | * 6/2002 | Gudesen et al. .............. | 438/99 |

FOREIGN PATENT DOCUMENTS

| | | | |
|---|---|---|---|
| EP | 0399299 A2 | 11/1990 | |
| WO | 99/10929 | 3/1999 | |
| WO | WO9910929 | 3/1999 | ......... H01L/21/768 |
| WO | WO9917352 | 4/1999 | ......... H01L/21/445 |

OTHER PUBLICATIONS

"Polymeric Integrated Circuits and Light Emitting Diodes" □□D.M.de Leeuw et al.□□IEEE—IEDM (1997), pp. 331–337.*
"VLSI Technology", S.M. Sze, McGraw–Hill, p. 447.
"All–Polymer Field–Effect Transistor Realized by Printing Techniques", by F. Garnier et al, Science, vol. 265, Sep. 16, 1994, pp. 1684–1686.

* cited by examiner

Primary Examiner—Mark F. Huff
Assistant Examiner—K Sager
(74) Attorney, Agent, or Firm—Daniel J. Piotroski

(57) ABSTRACT

The present invention provides a method of photochemically producing a vertical interconnect between a first and a second thin-film microelectronic device in an vertical interconnect area which comprises an overlap of a stack of a first electrically conducting area, optionally an organic electrically semiconducting area, an organic electrically insulating area comprising adapted photoresist material and a second organic electrically conducting area, wherein the organic electrically insulating area is removed within the overlapping area and substituted by an electrically conducting area which is extended from at least said first or said second electrically conducting area. The method is useful in the manufacture of electronic devices, preferably integrated circuits, consisting substantially of organic materials.

14 Claims, 2 Drawing Sheets

METHOD OF PRODUCING VERTICAL INTERCONNECTS BETWEEN THIN FILM MICROELECTRONIC DEVICES AND PRODUCTS COMPRISING SUCH VERTICAL INTERCONNECTS

BACKGROUND OF THE INVENTION

The present invention relates to a method of providing a vertical interconnect between a first and a second thin-film microelectronic device, wherein a vertical interconnect area is provided which is an area of overlap of a stack comprising a first electrically conducting area, an organic electrically insulating area and a second electrically conducting area, said first electrically conducting area being electrically connected to a terminal of said first microelectronic device and said second electrically conducting area being electrically connected to a terminal of said second microelectronic device.

Such a method is known from WO 99/10929, which discloses mechanically forming a vertical interconnect between a first and a second thin-film microelectronic device using a tool tip to make a notch in a vertical interconnect area of two organic electrically conducting areas which are separated from each other by an organic electrically insulating area. The tool tip is preferably tapered and has a preferred tip radius between 0.1 μm and 5.0 μm. The first and second electrically conducting areas are made of organic material including heavily doped semiconducting polymers, such as a polyaniline. The organic electrically insulating materials used for the insulating area are exemplified by a polyvinylalcohol or a polyvinylphenol.

Electronic circuits based partly or entirely on organic polymeric materials are foreseen to play a major role in the coming years in areas of electronics where low cost or flexibility is an essential requirement. Application areas such as electronic barcodes and smart cards are the current target areas since the prime concern for such products is cost. Organic polymeric materials are easy to apply by known techniques such as spin coating or printing and thus offer significant potential cost savings over conventional silicon technology where photolithography, implantation and etching are necessary. In addition polymeric materials offer excellent mechanical properties such as flexibility.

In integrated circuits (ICs) which are constituted by a plurality of thin-film microelectronic devices, for example a plurality of field-effect transistors, memory units, rectifiers, diodes as well as antennas interconnects between such devices are to be provided. An interconnect provides an electrical connection between a terminal of a first and a second thin-film microelectronic device. Sometimes, it is necessary to provide an interconnect which extends through a stack of layers. An interconnect of this type is referred to as a vertical interconnect or, in short, a "via".

In silicon-based IC technology, vertical interconnects are made by photo-lithographically defining a contact window, etching so as to obtain a contact hole and, subsequently, filling the contact hole by depositing metal; see, e.g., VLSI Technology, ed. Sze, McGraw-Hill (1983), p 447.

Microelectronic devices consisting substantially of organic materials have been disclosed, for example by Garnier et al., Science (1994) 265:1684–1686, but no methods of making vertical interconnects between thin film devices were mentioned. Microelectronics based on organic materials may be effectively used in applications where the use of silicon-based technology is prohibitively expensive.

U.S. Pat. No. 4,702,792 describes a method of forming fine conductive lines, patterns and connectors, wherein polymeric photoresist material is applied to a substrate and is patterned to form openings and spaces which are then filled with conductive material of metal or metal alloy. The patterned photoresist is preferably treated with an organo-metallic compound to create an etch-resistant form of the photoresist. Excess conductive material is removed by chemical-mechanical polishing to expose the polymeric material. No disclosure is made of a vertical interconnect between a first and second thin-film microelectronic device, such as an integrated circuit.

U.S. Pat. No. 5,567,550, U.S. Pat. No. 5,677,041 and U.S. Pat. No. 5,691,089 describe the fabrication of a mask for making integrated circuits formed in radiation sensitive material, in which a doped radiation sensitive layer, preferably of polyimide, is formed on a substrate, un undoped polyimide layer is formed over the doped polyimide layer which is radiated to form first and second source drain regions extending to a top portion of the doped polyimide region. A top portion of the undoped polyimide is also irradiated to form a gate region between the first source/drain region and the second source/drain region. A channel is thereby formed in the doped layer beneath the gate region.

U.S. Pat. No. 5,689,428 discloses integrated circuits, transistors, data processing systems etc. which are made by a process including steps of applying an electrical resistance body of radiatively dosed radiation sensitive polymeric material. The radiation sensitive material preferably comprises a polyimide.

EP-A-0 399 299 discloses electron discharge layers containing electrically conductive polymeric materials comprising doping precursors which generate dopants upon exposure of energy. Conductivity can be selectively induced in the polymer by selectively doping under selective exposure to a source of energy which causes the reagent to decompose to dope those regions in the polymer which are exposed to the energy forming a conductive polymer in exposed regions. In the exposed region/the polymer is rendered insoluble and in the unexposed regions the polymer is soluble and can thereby be removed to act as a negative photoresist which is selectively electrically conducting.

In polymeric integrated circuits, mechanical techniques are currently used for providing vertical interconnects between thin-film electronic devices; see WO 99/10929, mentioned above. A drawback of mechanical vertical interconnects is the limited throughput due to the sequential nature of the process and the limited positional accuracy which requires the use of a relatively large surface area. Moreover, a mixture of technologies such as photolithography and mechanical stitching is not desirable for the realization of a reel-to-reel process.

SUMMARY OF THE INVENTION

Therefore, an object of the present invention is to provide an efficient method for producing vertical interconnects which preferably are substantially made of organic polymeric materials, which obviates the problems mentioned.

It has now been found that vertical interconnects in substantially plastic electronics can be efficiently and reliably produced photochemically, wherein a photochemical resist is used which is chosen such that the part outside the overlapping area is maintained as electrically insulating area or part thereof, resulting in products with excellent properties. The method is therefore suitable for large scale production.

In accordance with the present invention there is provided a method of producing a vertical interconnect between a first and a second thin-film microelectronic device, wherein a vertical interconnect area is provided which is an area of overlap of a stack of layers comprising a first electrically conducting area, an organic electrically insulating area, a second organic electrically conducting area, and optionally an organic electrically semiconducting area, said areas being formed one by one, and at least one of said first or said second electrically conducting areas being positioned adjacent to and after said organic electrically insulating area, said first electrically conducting area being electrically connected to a terminal of said first microelectronic device and said second electrically conducting area being electrically connected to a terminal of said second microelectronic device, characterized in that said organic electrically insulating area comprises photoresist material, said insulating area is removed within said area of overlap before said adjacent first or said second electrically conducting area is positioned, and said removed insulating area is substituted by an electrically conducting area which is extended from at least said first or said second electrical conducting area, thereby forming the vertical interconnect.

In a preferred embodiment of the invention, the layer forming said organic electrically insulating area comprising photoresist material is removed photochemically within the area of overlap. Such a method comprises, for example, mixing the organic insulating area with a photoinitiator and/or a crosslinking agent, selectively exposing said mixture e.g. through a mask within the overlapping area to an energy source, for example deep UV radiation, such that the selective crosslinking of the insulator is catalyzed by the photoinitiator. The non-exposed parts are then removed in a conventional manner, for example by washing with propyleneglycol methyl ether acetate, or any other suitable agent known in the art.

Alternatively, the solubility of the exposed parts is improved by exposing the mixture to deep UV radiation, or another conventional energy source, and these exposed parts are then removed. Therefore, in general, the solubility of the unexposed area is different from that of the exposed area, enabling the removal of materials which have been made soluble from said insulating area.

In a particularly preferred embodiment of the invention the organic electrically insulating area consists essentially of adapted photosensitive material, which preferably serves as a gate dielectric.

Examples of photoresists (e.g. adapted photosensitive material) which can be suitably used in the practice of the present invention include hard-baked novolaks, conventional photoresists comprising polymers such as polyvinylphenols (e.g. UV flood-exposed PVPs), polyglutarimides, polyimides, polyvinylalcohols, polyisoprenes, polyepoxy-based resins, polyacrylates, polyvinylpyrrolidone, p-hydroxystyrene polymers, and melamino polymers. Therefore, the process according to the present invention is generally applicable in a wide range of applications. When a hard-baked novolak is used, the novolak photoresist is typically exposed to a source of radiation to which it is sensitive, in order to create a latent image. This latent image is subsequently developed using standard aqueous base developer. After development, the patterned resist is baked at a temperature of at least 150° C., to provide the hard-baked patterned novolak resist. Commercially available novolak photoresists of the type that can be suitably used in the practice of the present invention include HPR 504. It will be evident to one skilled in the art that it may be desirable to select a photoresist which can be treated by a "neutral" developer based on organic solvents, such as toluene or xylene propylene glycol methylether acetate, in order to avoid possible affects to adjacent layers. For example, when acid-doped conductive polymers are applied, such as polyanilines, the use of basic developers is not favored since this may lead to removal of the doped materials and, accordingly, to a higher sheet-and contactresistance. "Stack integrity" is therefore crucial. Particularly preferred groups of photoresists are selected from the group of polyisoprenes and polyepoxy-based resins, and a commercially available polyepoxy-based photoresist which can be suitably used is SU8. The SU8 is a negative, epoxy-type, near-UV photoresist.

In another preferred embodiment of the invention, said organic electrically insulating area comprises an organic electrically insulating polymeric compound which is capable of being crosslinked, usually with a crosslinking agent. There are no restrictions on the selection of polymeric insulators except that they are most preferably photochemically patterned. It has been found that polyvinylphenol and polyvinylalcohol are suitable insulating polymeric materials, of which polyvinylphenol is preferred. Suitable crosslinking agents include aminoplasts, such as hexamethoxymethylmelamine (HMMM).

In still another preferred embodiment of the invention, said organic electrically insulating area further comprises a photoinitiating agent which upon exposure to photoenergy, preferably UV radiation, catalyses the crosslinking of said organic electrically insulating polymeric compound and said crosslinking agent. A variety of compounds which are known in the art can be used as photoinitiators, such as onium salts, triflate salts and bisazides. A suitable and preferred photoinitiator is, for example, biphenyliodoniumhexa-fluoroborate.

Although the present inventors do not wish to be bound to any theory as to how and why the method works, the method is found to be simple, accurate, and very reliable. Typically, it is possible to make 118 vias, each via having a contact resistance in the range of from about 10 kΩ up to about 1 MΩ on average (when the electrically semiconducting area is positioned between the said two electrically conducting areas, the conventional "top gate structure"), in a single run without a single failure. The method appears therefore to be effective, substantially irrespective of the material properties of the organic materials used. The contact resistance in these structures is dominated by the Ohmic conductivity of the semiconducting PTV film and is low enough to be applied in electronic devices such as polymeric integrated circuits.

Alternatively, the semiconducting area is positioned on top of a stack comprising the first electrically conducting area having a gate electrode, the insulating area and the second electrically conducting area having a source and a drain electrode. The via in this stack, also referred to as a "bottom gate structure", has typically a contact resistance in the range of 100 Ω to 2 kΩ. Hundreds of such vias can be manufactured without any problem in a single run without a single failure.

The choice of the electrically conducting material used to form the first and second electrically conducting areas is not critical either. Preferably, the areas consist of an organic substance. Suitable examples include heavily doped semiconducting polymers known per se, such as a polyaniline (PANI), a polythiophene, a polypyrrole, a polyphenylene, and a polyphenylenevinylene.

Alternatively, heavily doped substituted derivatives of these polymers can be applied. Examples of suitable substituents include alkyl and alkoxy groups and ring-shaped groups, such as alkylenedioxy. Preferably, the substituent groups have a carbon chain of 1 to about 10 carbon atoms. A preferred example is poly-3,4-ethylenedioxythiophene (PEDOT).

in another preferred embodiment of the method according to the invention, the first and/or second electrically conducting area comprises an electrically conducting polyaniline. By using electrically conducting polyaniline, the conductivity of which typically is 10 to 100 S/cm, a vertical interconnect can be made having a contact resistance as low as 1 k$\Omega$. For many applications, this resistance is sufficiently small. For example, if the via interconnects field-effect transistors consisting substantially of organic materials, the current flowing through the via will typically be in the order of $10^{-9}$ to $10^{-6}$ amps. Given a resistance of 3 k$\Omega$, the resulting voltage drop across the vertical interconnect is negligible.

Generally, the first and second electrically conducting areas are patterned using a conventional, preferably photochemical patterning technique. For example, when a doped polyaniline film is applied as the electrically conducting area is typically prepared by dissolving polyaniline doped P+ with camphorsulphonic acid in a solvent such as m-cresol, adding a photoinitiator to this solution which is then spin-coated onto a substrate such as polyimide foil. The film is exposed in a nitrogen atmosphere through a mask to deep UV radiation. Upon exposure the conducting aniline is reduced to the nonconducting form. As a result, conducting tracks are embedded in an otherwise insulating film. The height differences between the exposed and unexposed parts of the film, with a thickness of typically 0.2 $\mu$m, is less than 50 nm and therefore no further planarization is necessary. If desired, the exposed part, i.e. the nonconducting form, is removed by using a conventional technique, such as a suitable solvent like N-methyl pyrrolidone. In certain embodiments of the invention, it is preferred to remove the nonconducting form before applying a next layer. For example, when fabricating a bottom gate structure (see below), it is generally recommended to remove said nonconducting form from the patterned second electrically conducting area before the organic semiconducting layer is applied on top.

It may be useful to apply a metal layer as the first electrically conducting area together with or instead of the organic electrically conducting layer. The metal layer may be comprised of any. conventional metal or alloy or mixture of metals which are known in the art for this purpose, for example copper or copper-based alloys. Preferably, the metal layer is essentially made of a thin gold or a gold-containing alloy or mixture (e.g. gold-titanium) which is not affected by chemicals used in the manufacturing of adjacent layers. The metal layer is usually deposited by evaporation on the substrate, using conventional techniques and is then patterned also using conventional techniques, such as etching with KI/$I_2$.

The stack optionally comprises an organic electrically semiconducting area which may be situated between any of the areas described above depending on its intended use, for example between the first electrically conducting area and the insulating area or between the insulating area and the second electrically conducting area, or the organic semiconducting area may be the upper layer (e.g. in a bottom-gate configuration). The choice of the organic semiconducting material is not very critical and inter alia depends on the intended use. In principle any conjugated polymer and oligomeric analogue with semiconducting properties which is suitable for making field-effect transistors can be used. Examples of such suitable materials include polyacenes, polypyrroles, polyphenylenes, polythiophenes, polyphenylene-vinylenes, poly(di)acetylenes, polyfuranylenes-vinylenes, polyfuranes, and polyanilines. Alternatively, substituted derivatives of these polymers are applied. Examples of suitable substituents include alkyl and alkoxy groups and ring-shaped groups, such as alkylenedioxy. Preferably, the substituent groups have a carbon chain of 1 to 10 carbon atoms. A suitable and preferred semiconducting material comprises poly(thienylene vinylene) or a poly-3-alkylthiophene, such as poly-3-hexylthiophene.

The stack of electrically conducting, semiconducting and insulating areas is preferably carried by a supporting substrate. Such a supporting substrate suitably comprises a synthetic polymeric resin, such as a polyimide. Glass or silica supporting substrates are also suitable.

The vertical interconnect area has a surface area, as defined by the size of one of the electrically conducting areas. This surface area is in the order of 10 $\mu$m×10 $\mu$m to 50 $\mu$m×50 $\mu$m. Further on, the vertical interconnect area has a cross-sectional size. This size, as defined by the smallest conducting area in the via stack, is suitably about 2 $\mu$m×2 $\mu$m to 10 $\mu$m×10 $\mu$m.

A suitable thickness of the stack constituting the vertical interconnect area is 2 $\mu$m or less. A larger thickness, for example from 5 $\mu$m to 20 $\mu$m, is also possible.

Preferably, the stack has a thickness in the order of 700 nm to 1 $\mu$m. This allows for ultrathin electronic devices, which can be integrated into packages, security documents, banknotes and the like.

By simply expanding the stack comprising the vertical interconnect area with further electrically conducting areas and/or further insulating areas, the method of the present invention can be used to provide multilevel vertical interconnects.

The method according to the invention is to provide a vertical interconnect between a first and a second thin-film microelectronic device. Obviously, this can only be done if the first and second electrically conducting areas of the vertical interconnect area are connected to the first and second thin-film microelectronic device, respectively. Although the method can be suitably used in conjunction with any type of organic thin-film microelectronic device, the method is particularly effective in forming a vertical interconnect between field-effect transistors consisting substantially of organic materials.

In a further aspect, the present invention relates to a structure comprising a vertical interconnect between a first and a second thin-film microelectronic device wherein a vertical interconnect area is provided which is an area of overlap of a stack of layers comprising:

a first electrically conducting area, which is electrically connected to a terminal of said first microelectronic device an organic electrically insulating area separating said first and said second thin-film microelectronic device outside said area of overlap, said organic electrically insulating area comprising adapted photoresist material, a second organic electrically conducting area, which is electrically connected to a terminal of said second microelectronic device, optionally an organic electrical semiconducting area, which is positioned between said first electrically conducting area and said organic electrical insulator or between said organic electrically insulator and said second electrically conducting area, or which is an outside layer opposite to the support, wherein at least one of said first or said second electrically conducting areas is positioned adjacent to said organic electrically insulating area, said vertical interconnect being an organic electrically conductive area which extends from at least one of said first or said second electrically conducting area.

In a particular preferred embodiment of the invention the electrically semi-conducting area is positioned at the outside of the stack, preferably opposite the substrate (the so-called "bottom gate" structure or geometry). Typically, vertical interconnects in such bottom gate structure each have a contact resistance which is usually less than 1 kΩ on average. If desired, the stack is provided with a protective coating. The bottom-gate geometry offers a number of advantages including the following. Firstly, it is not restricted to insoluble, noncrystalline materials as the active semiconductor. This is illustrated in the present invention by FETs made from pentacene, a highly crystalline organic molecule. Secondly, it is preferable that the organic semiconductor layer is processed in the final step since the performance of the semiconductor, and hence the performance of a transistor, can be adversely affected by exposure to chemicals and/or heating steps in any further processing steps. Thirdly, vertical interconnects with low contact resistance are readily obtainable by photolithographically patterning the dielectric insulator layer, whereas in a top-gate transistor the contact resistance of the vertical interconnects is increased due to the high-ohmic semiconductor that is positioned between the source-drain electrode layer and the gate electrode layer. A semifabricate comprising the stack conductor-insulator-conductor usually is very stable.

The present invention further relates to electronic devices comprising at least one vertical interconnect which is obtainable by the method according to this invention, or a structure comprising an vertical interconnect, as defined above. Electronic devices include ICs displays, smartcards, identification tags and the like.

A preferred electronic device includes an integrated circuit, which preferably substantially consists of organic materials. As a result of the low cost of organic materials and their ease of processing, an integrated circuit consisting substantially of organic materials, in short an organic IC, can be manufactured at a much lower cost than a siliconbased IC.

In a particularly preferred embodiment, the thin-film devices are part of the stack of layers used to form the vertical interconnect area. In this case, a stack comprising only four layers, usually three of which are patterned, is sufficient to provide an IC. A thin-film microelectronic device which may be conveniently accommodated by such a four-layered stack is a field-effect transistor.

Examples of circuits which can be successfully implemented in this manner include logic gates, such as an invertor, a NAND gate, a NOR gate, and an AND gate as well as combinations thereof, such as flip flops, frequency dividers and ring oscillators. In addition, the process according to the invention can also be used for the production of Mask-ROMs. Examples of such applications of vertical interconnects are given in our WO 99/10929, which is incorporated herein by reference.

The invention relates to an electronic device further comprising a second electrically conducting area which is substantially of metal instead of organic material as is claimed in claim 18.

In a preferred embodiment the electronic device is a circuit comprising a first and a second thin-film microelectronic device substantially consisting of organic materials as is claimed in claim 19.

BRIEF DESCRIPTION OF THE DRAWINGS

These and other aspects of the invention will be apparent from and elucidated with reference to the more specific embodiments described hereinafter.

DESCRIPTION OF THE PREFERRED EMBODIMENTS

Figure 1:
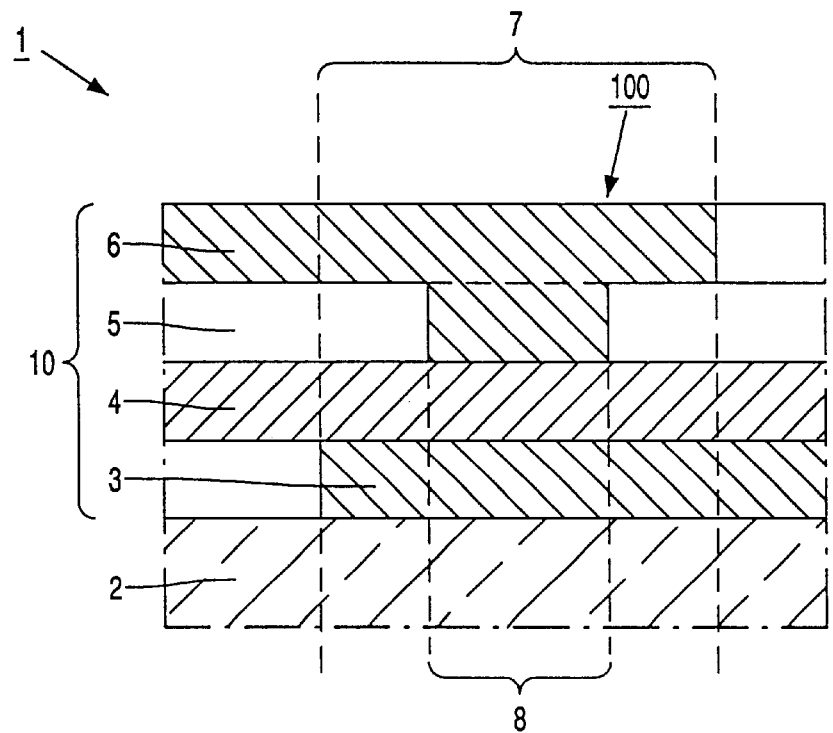
Figure 2:
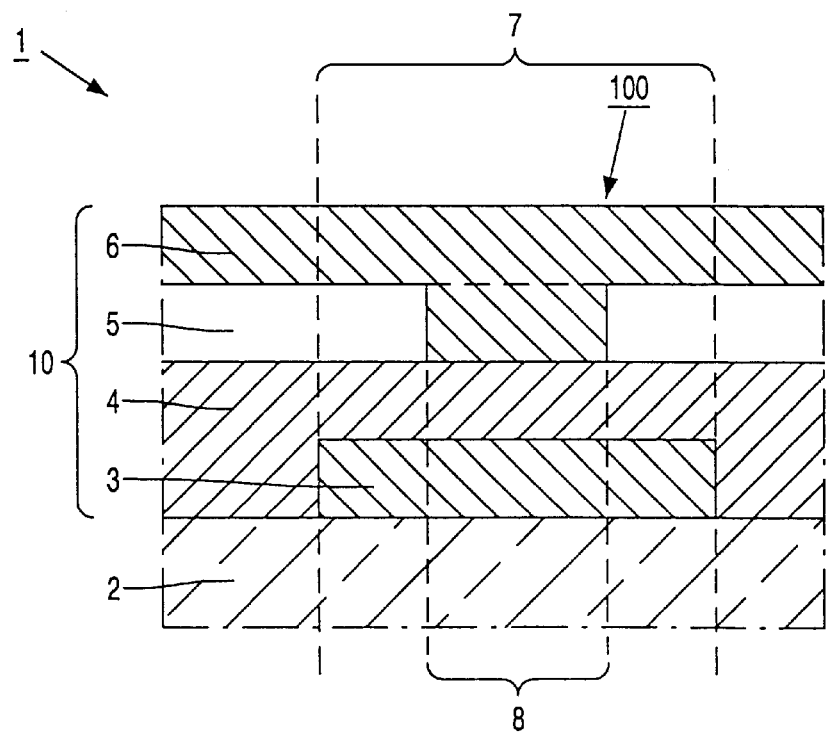
Figure 3:
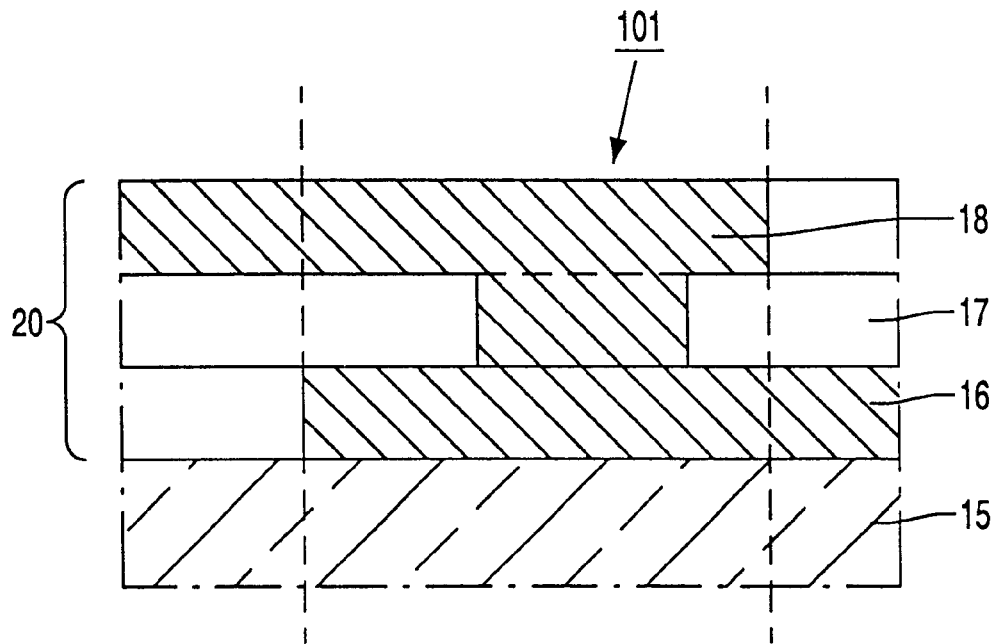
Figure 4:
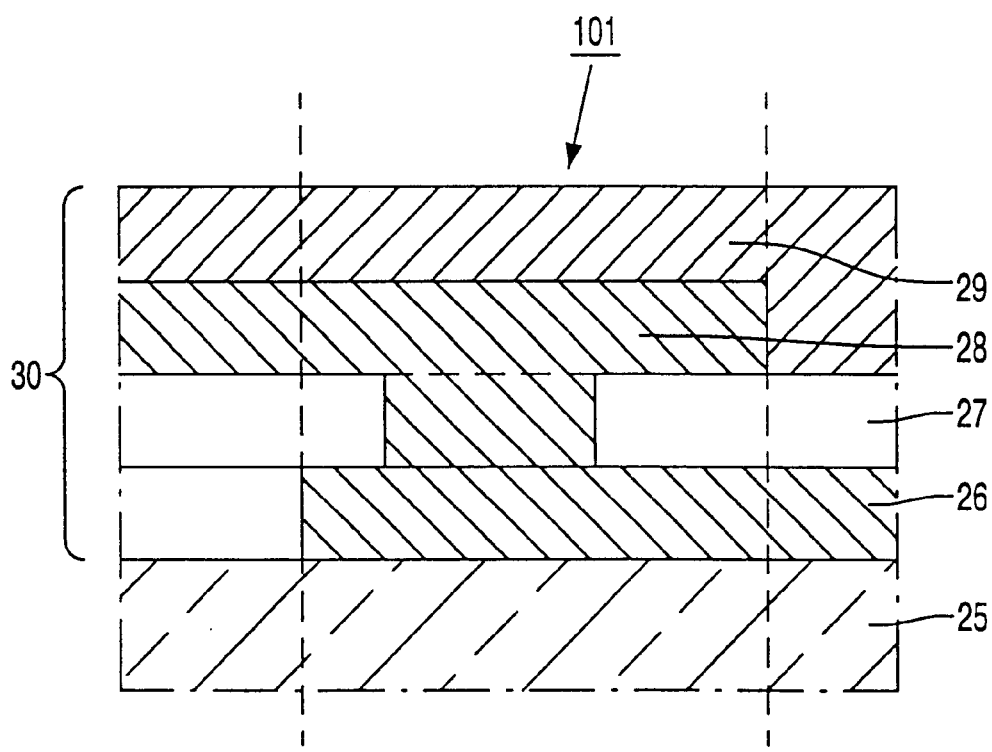

In the drawings,

FIGS. 1 and 2 are schematic cross-sectional views of a vertical interconnect area in a laminate comprising a substrate, a first conductive area, a semiconducting area, an insulating area, and a second conductive area, as described in Example 1, FIG. 3 is a schematic cross-sectional view of a vertical interconnect area in a laminate comprising a substrate, a first conductive area, an insulating area, and a second conductive area, as described in Example 5, and FIG. 4 is a schematic cross-sectional view of a vertical interconnect in a bottom gate structure, as described in Examples 7–10.

MATERIALS AND METHODS

The preparations of a conducting polyaniline solution and a precursor poly(thienylene vinylidene) solution are essentially the same as described in WO 99/10929, and are repeated below for convenience.

A. Preparation of a Conducting Polyaniline (PANI) Solution

Emeraldine base polyaniline (Neste) (0.7 g, 7.7 mmol) and camphor sulphonic acid (Janssen) (0.8 g, 3.4 mmol) are ground together with a mortar and pestle in a nitrogen-filled glove box. The mixture is split in two and placed in two 30 ml polyethylene bottles each containing 30 g m-cresol and three agate balls (0.9 mm diameter). These are placed in a shaker (Retsch MM2) operating at full speed for 14 to 18 hours. The contents of the bottles are combined and then sonified for 5 minutes. The mixture is cooled to room temperature and the sonification process is repeated. This mixture is centrifuged at 12,500 rpm for 2 hours. The conducting polyaniline solution thus obtained is pipetted off leaving any solids on the bottom of the centrifuge tubes.

B. Preparation of a Precursor Polythienylene-vinylene (PTV) Solution

A quantity of 10.0 g (0.028 kol) 2,5-thienylenedimethylene bis(tetrahydrothiophenium chloride) (supplier Syncom BV, Groningen, The Netherlands) is dissolved in 100 ml of a 2/1 v/v mixture of methanol and demineralized water and cooled to −22° C. in a nitrogen environment. Pentane (120 ml) is added and then sodium hydroxide (1.07 g, 0.0268 mol) dissolved in 100 ml of a 2/1 v/v mixture of methanol and demineralized water and cooled to −22° C. is added instantaneously to the stirred monomer solution kept at −22° C. That temperature is maintained for 2 hours and the mixture is then neutralized using 1.5 ml 2 N HCl. After having stored the mixture in a flask for 2 days, the liquid part is decanted off, and the remaining solid, the precursor poly(2,5-thienylene vinylene) is washed three times with methanol and dried in a vacuum. The precursor polymer is then dissolved in dichloromethane and concentrated to obtain a solution which after filtration (Millex LS 5 μm and Millex SR 0.5 μm) would give a 0.05 μm film if spin-coated (3 s/500 rpm, 7 s/1000 rpm) on a glass substrate.

EXAMPLE 1

Laminate 1: Substrate-PANI-PITV-PVP/HMMM-PANI (See FIGS. 1 and 2)

A 65 µm polyamide foil (supplied by Sellotape) is secured on a 3 inch silicon wafer. A solution of 10.0 g (0.083 kol) polyvinyl phenol (Polysciences Inc., cat #6527) and 1.625 g (4.17 mmol) hexamethoxymethylenemelamine (Cymel 300, Cyanamid) in 36 g propyleneglycol methylether acetate (Aldrich) is spin-coated (3 s/500 rpm, 27 s/2,000 rpm) onto the foil and then dried at 110° C. for 1 min on a hot plate. Cross-linking at 125 ° C. in a nitrogen atmosphere containing 5% v/v HCl for 5 min yields a 1.47 µm cross-linked polyvinylphenol film. The laminate thus obtained serves as the substrate 2 of which the polyvinylphenol coated side serves as the substrate surface on which subsequent layers are applied.

To 145 mg of the photochemical radical initiator 1-hydroxycyclohexyl phenyl ketone (Irgacure® 184, Ciba Geigy) is added 6 g of the conducting polyaniline (PANI) solution prepared under A above. After mixing well and sonifying twice for 1 min and cooling in between, the radiation-sensitive solution thus obtained is cooled and filtered (Millex FA, 1 µm). A radiation-sensitive layer is then formed by spin-coating (3 s/500 rpm, 7 s/2,000 rpm) 1 ml of the radiation-sensitive solution onto the polyvinylphenol-coated surface of the substrate 2, and drying on a hot plate (2 min at 90° C.). The wafer is placed in a Karl Suss MJB3 aligner equipped with a 500 W Xe lamp and flushed with nitrogen for 3 min. A mask is brought into contact with the radiation-sensitive layer. The mask is constructed such that the electrically conducting area 3 will not be irradiated by the irradiation which is to follow. While continuously flushing with nitrogen, the radiation-sensitive layer is irradiated via the mask with deep UV light (60 s, 20 mW/cm$^2$ at 240 nm), thereby forming a layer demonstrating a patchwork pattern of irradiated areas and nonirradiated areas, such as the electrically conducting area 3. The irradiated areas are dissolved during a single puddle development in 1-methylpyrrolidinone (NMP) as developer, after which the wafer is immediately rinsed with a mixture of first toluene and dichloromethane. The wafer is then heated on a hot plate (1 minute at 110° C.) so as to remove the unreacted photochemical radical initiator. Next, the wafer is rinsed with a 10%wt solution of camphorsulphonic in NMP and m-cresol (95:5 wt %) and subsequently rinsed with a mixture of toluene and dichloromethane. After heating the wafer on a hotplate for three minutes at 110° C., the sheet resistance of the area 3 is 1 kΩ/square (conductivity 60 S/cm).

It should be noted that in FIG. 1 the patterned electrically conducting area 3 comprises conducting tracks which is indicated by the shaded part, and the non-conducting form (e.g. after deep UV radiation through a mask) indicated by the blank part. If the nonconducting part is removed, as mentioned above, the empty space is filled by the next layer to be applied. Thus, if in FIG. 1 the nonconducting part in area 3 is removed, the empty space is filled by the semi-conducting substance of area 4, and the electrically semi-conducting area 4 is extended to this part of area 3, as can be clearly seen in FIG. 2. FIG. 4 depicts a similar situation with the electrically conducting area 28 and the electrically semiconducting area 29.

Immediately after having been filtered (Millex SR 0.5 µm), 3 ml precursor polythienylene-vinylene (PTV) solution prepared under B is spin-coated (3s/500 rpm, 7s/1,000 rpm) onto the layer comprising the electrically conducting area 3. The precursor layer thus obtained is heated on a hot plate at 150° C. for 30 min in a nitrogen atmosphere containing HCl gas at a partial pressure of 2.3×10$^{-3}$ bar, thus causing the precursor layer to be converted into a 100 nm thick semi-conducting area 4 comprising a polythienylenevinylene.

Polyvinylphenol (PVP).(4.0 g, 34 mmol) and hexamethoxymethylmelamine (HMMM) (0,65 g, 1.7 mmol) were dissolved in propyleneglycol methylether acetate (PYGMEA) (36 g). The solution was filtered using 0.2 µm Millex filters. Diphenyliodonium hexafluoro phosphate (10–20 mg) was added to this solution. After spin coating (3s/500 rpm, 27s/2,000 rpm) onto the area 4 a 300 nm thick layer was obtained which was subsequently pre-baked for one minute at 100° C. The film was exposed for three minutes to a high pressure mercury lamp (intensity approximately 4.5 mW/cm$^2$) through a mask. The exposed film was developed with PYGMEA to remove the non-crosslinked material, thus inter alia forming empty space in the electrically insulating area 5 which is the basis for vertical interconnect 100. One µm details were readily obtained.

Following the same procedure as that used for applying the electrically conducting area 3, only using a different mask, the second electrically conducting area 6 of polyaniline is provided on the area 5, at the same time filling the gaps in the electrically insulating area 5 which were created in the previous step.

The laminate 1, the stack 10 and the vertical interconnect area 100 are now complete. The cross-sectional size 8 of the vertical interconnect area measures 5 µm×5 µm and the surface area 7 measures 30×30 µm.

The laminate 1 thus obtained has a structure as shown in FIG. 1.

In this present example 1, a laminate having a structure as shown in FIG. 2 is obtained by modifying the above method in that the non-conducting areas of the layer containing the conducting area 3 are removed before the next layer, which is in this example the semi-conducting area 4, is applied.

Removing said non-conducting areas and, if appropriate, subsequently redoping the conducting area 3 in order to raise its conductivity to its original level can, at least when the conducting area 3 is made of PANI, improve the service life of the FET devices, reduce the leakage current to a negligible extent (less than one 1 pA for 1 µm channel length) and significantly reduce the hysteresis observed in the transfer characteristics.

If the conducting area 3 is, as in this present example 1, made of PANI the non-conducting areas of the layer containing the conducting area 3 can be removed by dissolving said non-conducting areas in, for example, N-methylpyrrolidone. A single puddle step for 10 s at 40 rpm and then 30 s at 2000 rpm is suitable for this purpose. Subsequently, the remaining conducting area 3 may be rinsed with toluene or dichloromethane and dried.

Redoping can be done by exposing the conducting area 3 to, for example, a N-methylpyrrolidone solution containing camphor-sulphonic acid (10% w/w) and m-cresol (4% w/w).

EXAMPLE 2

Laminate 2: Substrate-PANI-PTV-HPR504-PANI

A laminate was prepared having a first patterned electrically conducting polyaniline area on a substrate, and a electrically semiconducting polythienylene-vinylene area on said first patterned electrically conducting polyaniline area, which were prepared similar to the method described in Example 1.

A layer of novolak photoresist HPR504 (a positive photoresist) was applied to the semiconductor layer PTV, using standard spincoating techniques. The novolak coating was then heated to about 100° C. for one minute to produce a dry film thickness of about 250 nm. The novolak photoresist was then patterned by exposure to UV radiation and developed, using aqueous base PD 523 to create openings. The novolak photoresist was subsequently heated to 135° C. for a period of 2 minutes, 150° C. for a period of 5 minutes, and 200° C. for a period of 20 minutes. Optionally, the device is at that point etched with Ar/CF4 in order to remove the 50 nm PTV layer which lies bare in the openings in the layer of the novolak resist.

The schematic structure of laminate 2 is similar to the structures shown in FIGS. 1 and 2, with the proviso that PVP/HMMM should now read HPR504.

EXAMPLE 3

Laminate 3: Substrate-PANI-PTV-PANI

A laminate was prepared having a first patterned electrically conducting polyaniline area on a substrate, and a electrically semiconducting polythienylene-vinylene area on said first patterned electrically conducting polyaniline area, which were prepared similar to the method described in Example 1.

A layer of the polyepoxy-based photoresist SU8 purchased from Microresist technology was applied to the semiconductor layer PTV, using standard spincoating techniques. The polyepoxy-based coating was then heated to about 85° C. for 3 minutes to produce a dry film thickness of about 250 nm. The polyepoxy-based photoresist was then patterned by exposure to UV radiation and developed using the XP SU8 developer to create openings. The polyepoxy-based photoresist was subsequently dried by centrifuging and heated to 140° C. for 5 minutes. Optionally, the device is at that point etched with Ar/CF4 in order to remove the 50 nm PTV layer which lies bare in the openings in the layer of the novolak resist.

The schematic structure of laminate 3 is similar to the structures shown in FIGS. 1 and 2, with the proviso that PVP/HMMM should now read SU8.

EXAMPLE 4

Laminates 4 and 5: Substrate-Au/Ti-PTV-HPR504-PANI and Substrate-Au/Ti-PTV-SU8 PANI A titanium/gold stack (10 nm/90 nm) is evaporated on a glass substrate. This stack is patterned by using a combination of standard photolithographic techniques, for example spincoating a photoresist (here AZ6612, a positive resist), patterning the resist by exposure to UV radiation, developing the resist using a developer (such as the AZ726MIF developer), etching the Au and Ti layer, and stripping the photoresist.

The layer thus obtained serves as the first conductive layer on which subsequent layers are applied as given in Examples 2 and 3.

The schematic structure of the laminate 2 is similar to the structures shown in FIGS. 1 and 2, with the proviso that PVP/HMMM should now read HPR504 and PANI should now read Au/Ti.

EXAMPLE 5

Laminate 6: Substrate-PANI-SU8-PANI (FIG. 3)

A laminate comprising stack 20 was prepared having a first patterned electrically conducting polyaniline layer 16 on a substrate 15, which was prepared similar to the method described in Example 1.

A layer of the polyepoxy-based photoresist SU8 (Microresist technology) was applied to the polyaniline layer, using standard spincoating techniques. The polyepoxy-based coating was then heated to about 85° C. for 3 minutes to produce a dry film thickness of about 250 nm. The polyepoxy-based photoresist was then patterned by exposure to UV radiation and developed using the XP SU8 developer to create openings. The polyepoxy-based photoresist was subsequently dried by centrifuging and heated to 140° C. for 5 minutes to form the electrically insulating area 17.

Following the same procedure as used for applying the first electrically conducting area described in Example 1 only using a different mask, the second electrically conducting area of polyalinine 18 is provided on the electrically insulating area, at the same time filling the gaps in this insulating area which were created in the previous step.

EXAMPLE 6

Laminate 7: Substrate-Au/Ti-HPR504-PANI

To the patterned gold-titanium layer prepared according to the method of Example 4, a layer of novolak photoresist HPR504 was applied, using standard spincoating techniques. The novolak coating was then heated to about 100° C. for one minute to produce a dry film thickness of about 250 nm. The novolak photoresist was then patterned by exposure to UV radiation and developed, using aqueous base PD 523 to create openings. The novolak photoresist was subsequently heated to 135° C. for a period of 2 minutes, 150° C. for a period of 5 minutes, and 200° C. for a period of 20 minutes.

Following the same procedure as that used for applying the first electrically conducting area as described in Example 1 only using a different mask, the second electrically conducting area is provided on the electrically insulating area, at the same time filling the gaps in this insulating area which were created in the previous step.

The schematic structure of laminate 101 is essentially similar to the structure shown in FIG. 3. The thickness of the stack 20 is about 800 nm. The cross-sectionel size 8 of the via 101 is 2 $\mu$m×2 $\mu$m.

EXAMPLE 7

Laminate 8: Substrate-PANI-SU8-PANI-PTV (Bottom Gate Structure) (FIG. 4)

A laminate comprising stack 30 was prepared having a first patterned electrically conducting polyaniline layer 26 on a substrate 25, which was prepared similar to the method described in Example 1.

A layer of the polyepoxy-based photoresist SU8 purchased from Microresist technology was applied to the PANI layer, using standard spincoating techniques. The polyepoxy-based coating was then heated to about 85° C. for 3 minutes to produce a dry film thickness of about 250 nm. The polyepoxy-based photoresist was then patterned by exposure to UV radiation and developed using the XP SU8 developer to create openings. The polyepoxy-based photoresist was subsequently dried by centrifuging, and heated to 140° C. for a period of 5 minutes to form the electrically insulating area 27.

Following the same procedure as used for applying the first electrically conducting area described in Example 1 only using a different mask, the second electrically conducting area 28 is provided on the electrically insulating area 27, at the same time filling the gaps in this insulating area which were created in the previous step.

The vertical interconnects so manufactured show a connect resistance of typically 200–400 Ω.

A solution of the precursor polymer of polythienylene-vinylene that was filtered through a 0.2 μμm filter and then applied onto the second electrically conducting area 28 using spincoating. The precursor layer was then treated as in Example 1 to form the electrically semiconducting area 29.

EXAMPLE 8

Laminate 9: Substrate-PANI-SU8-PANI-Pentacene (Bottom Gate Structure)

The schematic structure of this laminate 9 is essentially similar to the structure shown in FIG. 4, except that the electrically semiconducting layer of PTV is replaced by a similar layer which is made of pentacene. Therefore, the same reference numbers have been used but with a single dash indication.

A stack was prepared on a substrate comprising the layers PANI-SU8-PANI, essentially as in Example 7.

A precursor molecule of pentacene (supplier Syncom BV, Groningen) was dissolved in dichloromethane to give a 1 wt % solution. This solution was filtered through a 0.2 mm filter and then applied onto the second electrically conducting area 28' using spincoating. The precursor layer thus obtained was heated on a hot plate at 200° C. for a few seconds, thus causing the precursor layer to be converted into a 100 nm thick layer electrically semiconducting area 29' comprising pentacene.

EXAMPLE 9

Laminate 10: Substrate-PEDOT-HPR504-PEDOT-PTV (Bottom Gate Structure)

The schematic structure of this laminate 10 is essentially similar to the structure shown in FIG. 4. Therefore, the same reference numbers have been used but with a double dash indication.

A composition comprising the commercially available photoresist HPR504 is spincoated onto a polyamide foil, then dried at 200° C. for 1 minute and irradiated with UV-light in an ozone atmosphere. The laminate thus obtained serves as the substrate 25" of which the HPR504 coated side serves as the substrate surface on which subsequent layers are applied.

A colloidal solution of 0.5 weight percent poly(3,4-ethylenedioxythiophene), 0.8 weight percent poly(styrene sulphonic acid), 0.15 weight percent 4,4-diazidodibenzalacetone-2,2'-disulphonic acid disodium salt and 0.005 weight percent dodecylbenzenesulphonic acid sodium salt in water was filtrated through a 5 μm filter. After filtration, the colloidal solution was spincoated onto the substrate surface. The layer obtained was dried at 30° C. for 5 minutes. The dried layer was exposed in a nitrogen atmosphere, via a mask to patterned irradiation with UV-light (X=365 mm) by means of a Hg lamp. The layer was washed by spraying with water. In this washing the unirradiated areas of the layer were dissolved. After drying, the average thickness of the layer was 80 nm. The remaining areas 26", which accomodate a first gate electrode are electrically conducting.

On top of this, a layer 27" of novolak photoresist HPR504 was applied by spincoating. The novolak coating was then heated to about 100° C. for one minute to produce a dry film thickness of about 250 nm. The novolak photoresist was then patterned by exposure to UV-irradiation and developed using aqueous base PD523 to create openings. The structure was subsequently heated to 135° C. for a period of 2 minutes, 150° C. for a period of 5 minutes, and 200° C. for a period of 2 minutes.

Following the same procedure as used for applying the electrically conducting area 26", only using a different mask, a second electrically conducting area 28" comprising poly (3,4-ethylenedioxythiophene) is provided on the area 27", at the same time filling the gaps in the electrically insulating area 27" which were created in the previous step. The second electrically conducting area 28" accomodates the source and the drain electrodes.

Immediately after having been filtered, 3 ml precursor polythienylene-vinylene solution is spincoated onto the layer comprising the electrically conducting area 28". The precursor layer thus obtained is heated at 150° C. in a nitrogen atmosphere, thus causing the precursor layer to be converted into a 50 nm thick semiconducting area 29" comprising a polythienylene-vinylene (PTV).

The laminate 10, the stack 30" and the vertical interconnect area in layer 27" are now complete. The surface area of the vertical interconnect area measures 10 μm×10 μm.

EXAMPLE 10

Laminate 11: Substrate-PANI-CS 100-PANI-PTV (Bottom Gate Structure)

The schematic structure of this laminate 11 is essentially similar to the structure shown in FIG. 4. Therefore, the same reference numbers have been used but with a triple dash indication.

The same procedure was followed as in Example 7 except that the commercially available photoresist CS 100 was applied instead of SU8, in the following way.

A layer of photoresist CS 100 (supplier Olin Microelectronic Materials) was diluted with xylene (Aldrich) to give a 250 nm thick layer when deposited onto the PANI layer using spincoating and heated to about 85° C. for 3 minutes. The photoresist was then patterned by exposure to UV radiation and developed using xylene as developer to create openings. The film was subsequently heated to 135° C. for a period of 3 minutes and then to 175° C. for 5 minutes to form the electrically insulating area 27'".

What is claimed is:

1. A method of producing a vertical interconnect between a first and second thin-film microelectronic device, wherein a vertical interconnect area is provided which is an area of overlap of a stack of layers comprising a first electrically conducting area, an organic electrically insulating area, a second organic electrically conducting area, and optionally an organic electrically semiconducting area, said layers of said stack being formed one by one, and at least one of said first or said second electrically conducting areas being positioned adjacent to and after said organic electrically insulating area, said first electrically conducting area being electrically connected to a terminal of said first thin-film microelectronic device and second organic electrically conducting area being electrically connected to a terminal of said second thin-film microelectronic device, characterized in that said organic electrically insulating area comprises photoresist material, said insulating area is removed within said area of overlap before said adjacent first or second electrically conducting area is positioned, and said removed insulating area is substituted by an electrically conducting area which is extended from at least said first or said second electrical conducting area, thereby forming the vertical interconnect;

wherein an outer part outside of said area of overlap is maintained as an electrically insulating area.

2. A method as claimed in claim 1, characterized in that said organic electrically insulating area outside said overlapping area is exposed to an energy source to effect the degree of crosslinking of said organic electrically insulating area, and removing the non-exposed parts of said organic electrically insulating area.

3. A method as claimed in claim 1, characterized in that said organic electrically insulating area at said overlapping area is exposed to an energy source to improve the solubility of the exposed parts, and removing the exposed parts of said organic electrically insulating area.

4. A method as claimed in claims 1, wherein said organic electrically insulating area consists essentially of an adapted photoresist material.

5. A method as claimed in claim 4, characterized in that said organic insulating area is a gate dielectric.

6. A method as claimed in claim 4, wherein said photoresist material is selected from the group consisting of hard-baked novolaks, flood-exposed polyvinylphenols, polyimide photoresists, polyisoprenes, and polyepoxy-based resins.

7. A method as claimed in claim 6, wherein the photoresist material is selected from the group consisting of polyisoprenes and polyepoxy-based resins.

8. A method as claimed in claim 1, wherein said organic electrically insulating area comprises an organic electrically insulating polymeric compound which is capable of being crosslinked with a crosslinking agent.

9. A method as claimed in claim 1, wherein said organic electrically insulating area further comprises a photoinitiating agent which upon exposure to photoenergy catalyses the crosslinking of said organic electrically insulating polymeric compound with an crosslinking agent.

10. A method as claimed in claim 1, wherein said organic electrically conducting area comprises an electrically conducting polymeric compound selected from the group consisting of polyaniline and poly(3,4-ethylenedioxythiophene).

11. A method as claimed in claim 1, wherein said first electrically conducting area is substantially comprised of a conductive metal or alloy or mixture of metals.

12. A method as claimed in claim 1, wherein said organic electrically semiconducting area is positioned between said first electrically conducting area and said organic electrically insulator or between said organic electrically insulator and said second electrically conducting area, or which is an outside layer.

13. A method as claimed in claim 1, wherein said organic electrically semiconducting area comprises a compound of the group consisting of polythienylene-vinylene, polyalkylthiophene, and pentacene.

14. An integrated circuit characterized in that it comprises at least one vertical interconnect obtainable by the method as claimed in claim 1.

* * * * *